(12) United States Patent
Yoshikawa et al.

(10) Patent No.: US 6,808,321 B2
(45) Date of Patent: Oct. 26, 2004

(54) OPTICAL COMMUNICATION MODULE

(75) Inventors: Satoshi Yoshikawa, Yokohama (JP);
Hiromi Kurashima, Yokohama (JP);
Yasushi Fujimura, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 133 days.

(21) Appl. No.: 10/230,399

(22) Filed: Aug. 29, 2002

(65) Prior Publication Data

US 2003/0059174 A1 Mar. 27, 2003

(30) Foreign Application Priority Data

Aug. 29, 2001 (JP) ........................................ 2001-260197

(51) Int. Cl.[7] .............................. G02B 6/38; G02B 6/36
(52) U.S. Cl. .............................. 385/92; 385/60; 385/88
(58) Field of Search .............................. 385/88, 92, 134

(56) References Cited

U.S. PATENT DOCUMENTS

| 5,945,688 | A | * | 8/1999 | Kasahara et al. | ............. 257/81 |
| 6,263,137 | B1 | * | 7/2001 | Yoneyama et al. | ........... 385/49 |
| 6,377,742 | B1 | | 4/2002 | Go | |
| 6,550,981 | B1 | * | 4/2003 | Yamauchi | ..................... 385/88 |
| 6,632,027 | B1 | * | 10/2003 | Yoshida et al. | ............... 385/88 |
| 6,668,140 | B2 | * | 12/2003 | Tatsuno et al. | ............. 398/200 |

* cited by examiner

*Primary Examiner*—John D. Lee
*Assistant Examiner*—Tina M Lin
(74) *Attorney, Agent, or Firm*—McDermott Will & Emery LLP

(57) ABSTRACT

The present invention provides an optical module in which the level of the lead frame coincides with the optical axis of the fiber. The module 1 comprises a container 4, a subassembly 2 and a lead frame 6. The subassembly includes a substrate, on which the semiconductor optical device and the optical fiber are mounted. The lead frame has a pair of fixing bar and inner leads. The fixing bars extend along a first direction and attach to regions on the container. Respective inner leads extend along a second direction intersecting the first direction and have tips facing to respective fixing bars.

10 Claims, 20 Drawing Sheets

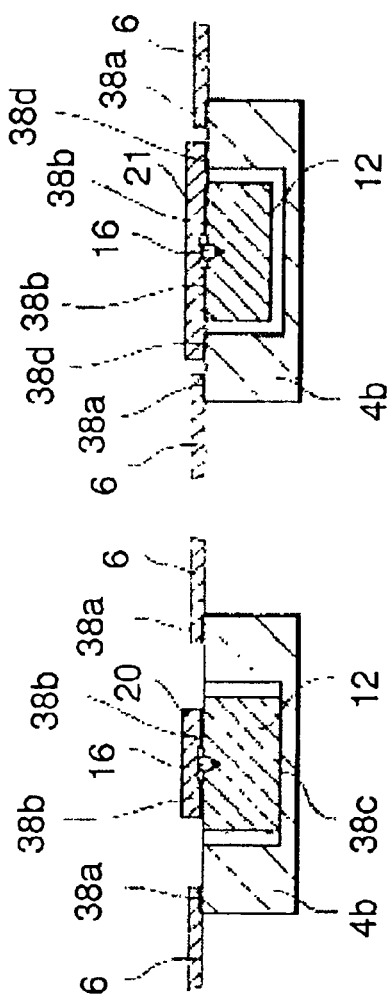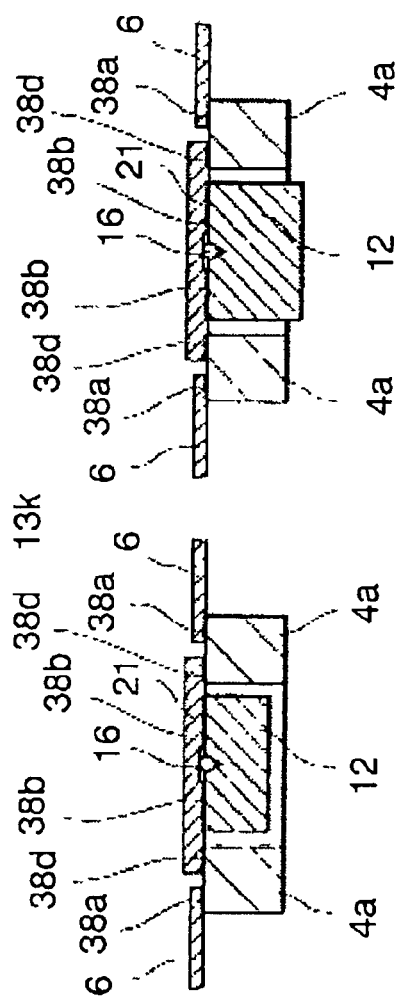

OPTICAL COMMUNICATION MODULE

CROSS REFERENCE RELATED APPLICATIONS

This application contains subject matter that is related to the subject matter of the following application, reference number 102198-US-00 (Ishiguro), which is assigned to the same assignee as this application and filed on the same day as this application. The below listed application is hereby incorporated herein by reference in its entirely:

"Optical Communication Moduk" by Yoshikawa et al.

BACKGROUND OF THE INVENTION

1. Field of the Invention

This invention relates to an optical communication module.

2. Related Prior Art

An optical communication module includes an optical semiconductor device, a lead frame and a substrate disposing the semiconductor device and an optical fiber thereon. The optical coupling between the semiconductor device and the optical fiber is realized on the substrate and the substrate is secured on an island of the lead frame. Such optical module is disclosed in U.S. Pat. No. 6,377,742.

In the conventional module shown in U.S. Pat. No. 6,377,742, however, it would be preferable for the manufacturing of the module that the level of the primary surface of the lead frame corresponds with that of the substrate.

SUMMARY OF THE INVENTION

The object of the present invention is to provide an optical communication module with a new configuration, in which the level of the lead frame and that of the substrate coincide to each other.

An optical communication module according to the present invention comprises a subassembly, a container and a lead frame. The subassembly includes an optical semiconductor device, a substrate, and an optical fiber coupled to the semiconductor device. The container secures the subassembly therein. The lead frame is fixed to the container so as to correspond the level of a primary surface of the lead frame with an optical axis of the fiber.

The subassembly includes a supplementary member to hold the optical fiber onto the substrate. The supplementary member has a first portion contacting to the substrate and a pair of second portion, each extending to the both side of the first portion.

The container includes a pair of side portion and a rear portion. The side portions extend along a first direction so as to define a room for securing the subassembly therein. The rear portion extends along a second direction intersecting the first direction and connects respective side portions. The rear portion provides a device-mounted area. Regions for fixing the lead frame are provided on respective edges in the surface of the side portions.

Another aspect of the present invention, the container further comprises a base portion addition to the pair of side portion and the rear portion. The base portion and the side portions define a room for securing the subassembly therein. Regions for fixing the lead frame are provided on respective edges in the surface of the side members. Since the container described above secures the subassembly within the room, the level of the primary surface of the substrate enables to align the surface of the lead frame.

The lead frame of the present invention may have a pair of fixing bar and a plurality of inner leads. The fixing bars extend along the first direction and correspond to respective regions provided on the side portions of the container, while the inner leads extend along the second direction.

The module may include a housing for covering the subassembly, the container and the lead frame. The housing may be a mold resin. The subassembly has the ferrule on the substrate. The ferrule and lead frames protrude from the housing.

It is preferable for the invention that the container is made of metal for shielding the subassembly and the optical semiconductor device is a light-emitting device or a light-receiving device.

From FIG. 20(a) to FIG. 20(d) show relations of the level of the surface of the lead frame to the primary surface of the container.

DETAILED DESCRIPTION OF THE PREFERRED EMBODIMENTS

The preferred embodiments and the manufacturing method of the optical module according to the present invention will be described in referring to drawings.

(First Embodiment)

Figure 1:
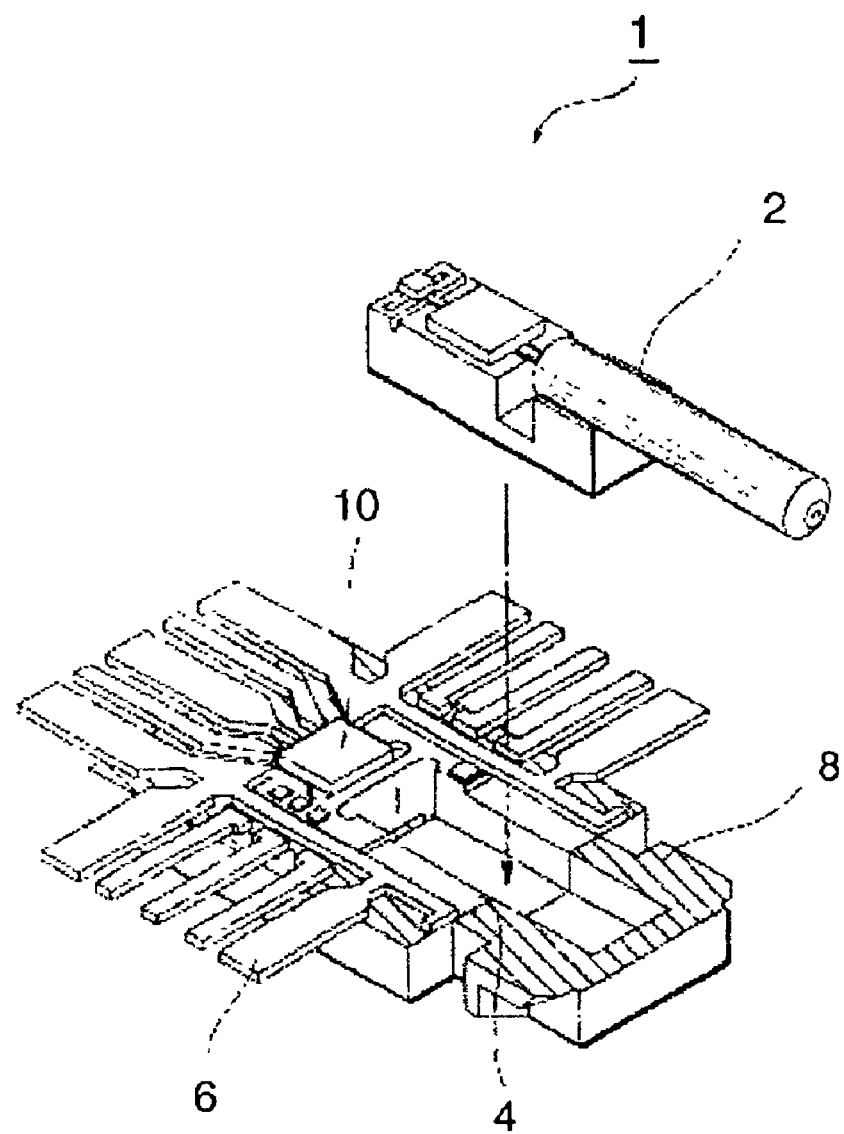
FIG. 1 is a view showing the optical module according to the present invention.

FIG. 1 shows the optical module of the present invention. The module 1 comprises a subassembly 2, a container 4, a lead frame 6, and housing 8. In the present embodiment, the housing 8 is a resin-molded, which molds the subassembly 2, the container and the lead frame 6. The container 4 includes a signal processing circuit 10 on a device-mounted area. In the case that the module is a light-receiving module, the signal processing circuit 10 amplifies an electrical signal from the light-receiving device, such as a photo diode. FIG. 1 is a cutaway viewing to show the inside of the housing 8. The subassembly 2 is installed along the arrows in the figure and placed within the container 8.

Figure 2A:
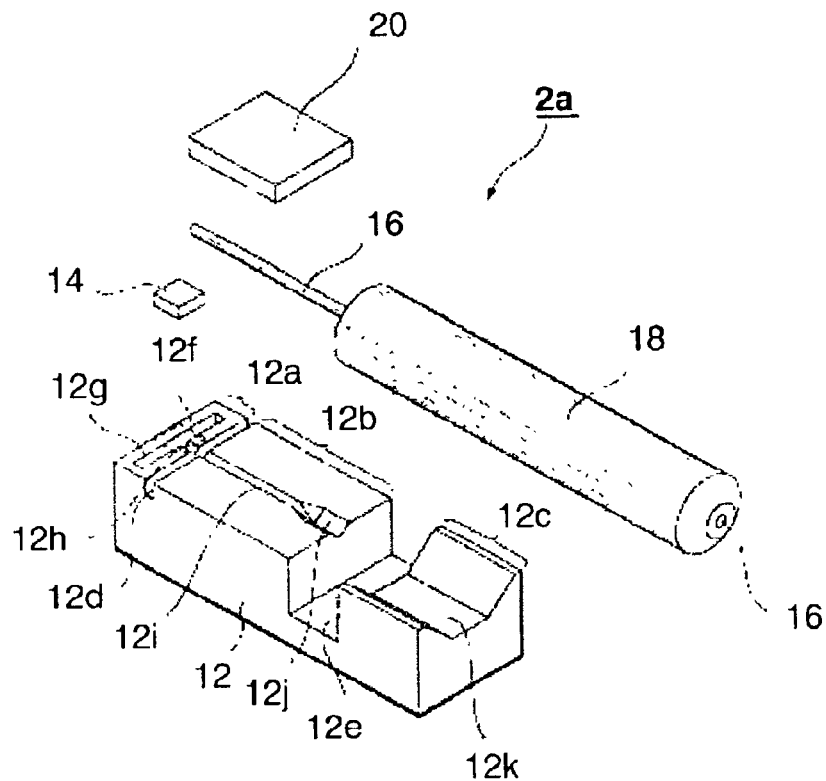
FIG. 2(a) and FIG. 2(b) show the subassembly of the module.
Figure 2B:
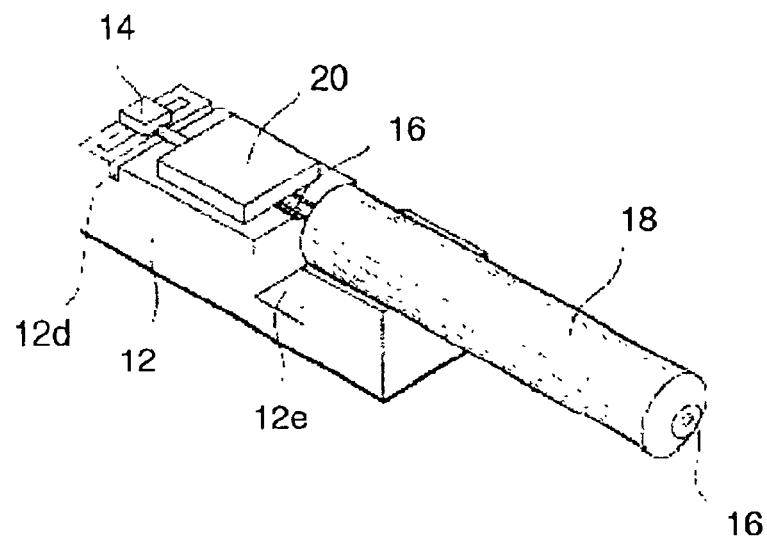

FIG. 2(a) and FIG. 2(b) show the subassembly 2a. The subassembly 2a includes a substrate, a light-receiving device 14, an optical fiber 16, a ferrule 18 and a supplementary member 20. The substrate 12 comprises a first region 12a, a second region 12b and a third region 12c, each of which are along an optical axis of the fiber 16. The groove 12d between the first 12a and second 12b regions has a fiber-abutted surface. This surface defines the tip position of the fiber. The another groove 12e is provided between the second region 12b and the third region 12c. The first region includes an optical device-mounted area and a groove 12g so as to intersect the optical axis of the fiber and a groove 12h. The light emitted from the fiber 16 is guided into the groove 12h, reflected at one surface of the groove 12h, and entered into the semiconductor device 14.

The second region 12b provides a groove 12i for securing the fiber by two surfaces of the groove, and an intermediate groove 12j. The third region includes another groove 12k for support the ferrule 18 thereinto. Typical cross sectional configuration of grooves 12i and 12k are V-shape and trapezoid, respectively. The substrate 12 mounts the optical device 14, the optical fiber 16 and the ferrule 18 thereon. The device 14 is optically coupled to one tip of the fiber. Another tip of the fiber is exposed on the one facet of the ferrule. The supplementary member 20 fixes the fiber to the substrate.

Figure 3A:
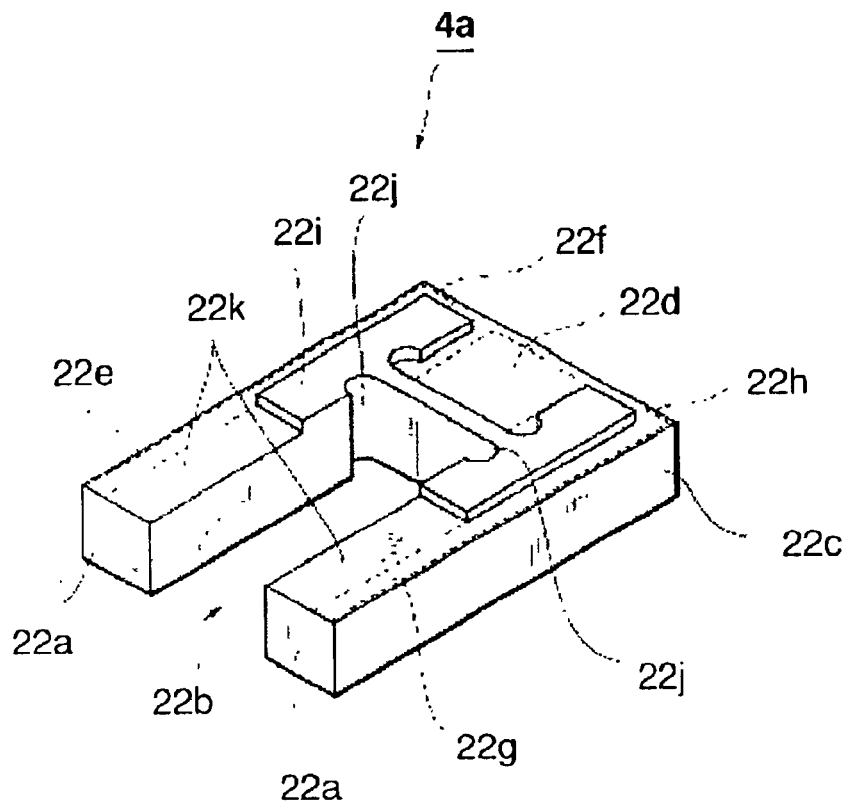
FIG. 3(a) and FIG. 3(b) show one type of the container of the invention.
Figure 3B:
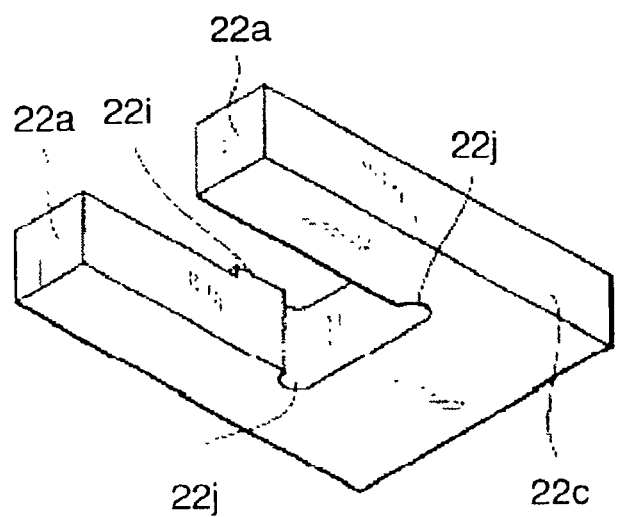

FIG. 3(a) and FIG. 3(b) are views showing one configuration of the container. The container 4a comprises a pair of side portion 22a and a rear portion 22c. The container 4a is preferable to be made of metal. The side portions extend along a first direction so as to define a room for securing the subassembly. The rear portion extends along a second direction intersecting the first direction and connects respective side portions. On the rear portion provides a device-mounted area. The device-mounted area is next to the room for securing the subassembly. The container includes regions 22e to 22h for fixing the lead frame thereto. Regions 22e and 22g are on respective edges of the side portion, while regions 22f and 22h are on the edge of the rear portion. Regions 22e to 22h surround a projection 22i, which is used as an alignment guide for the lead frame 6. The interval between respective side portions is slightly wider than the width of the substrate 12. Bores 22j are provided at the corner between respective side portions and the rear portion. The bores 22j enable to spread the surplus resin at the molding. The container is preferable to provide flat regions 22k to fix the supplementary member of the subassembly, which is referred by 2b in FIG. 10.

Figure 4A:
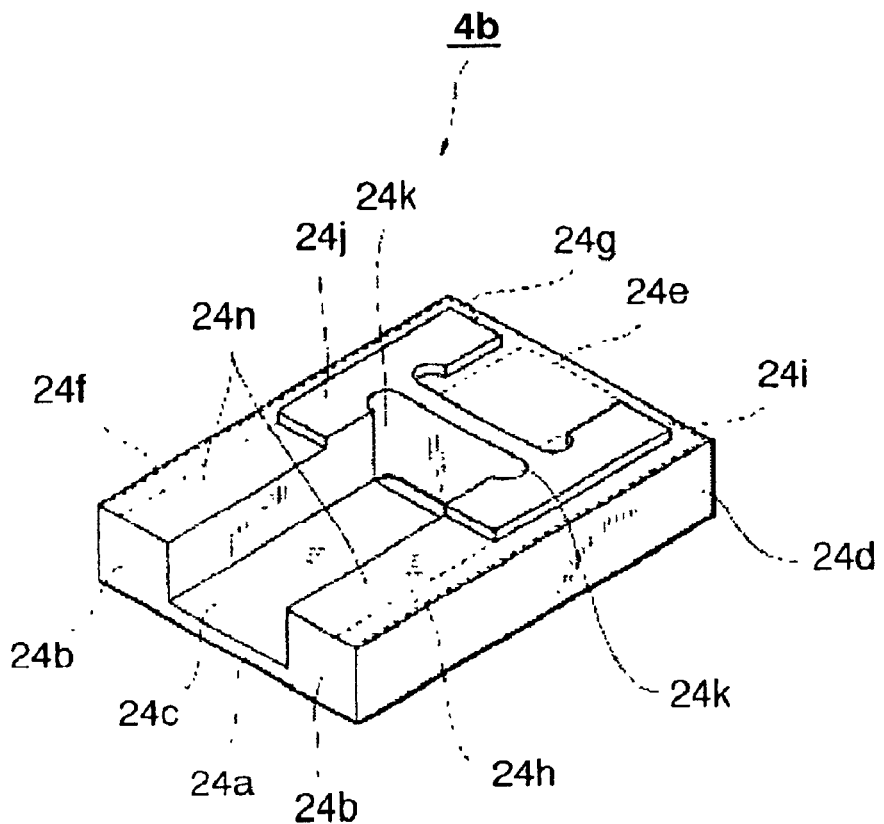
FIG. 4(a) and FIG. 4(b) show another type of the container.
Figure 4B:
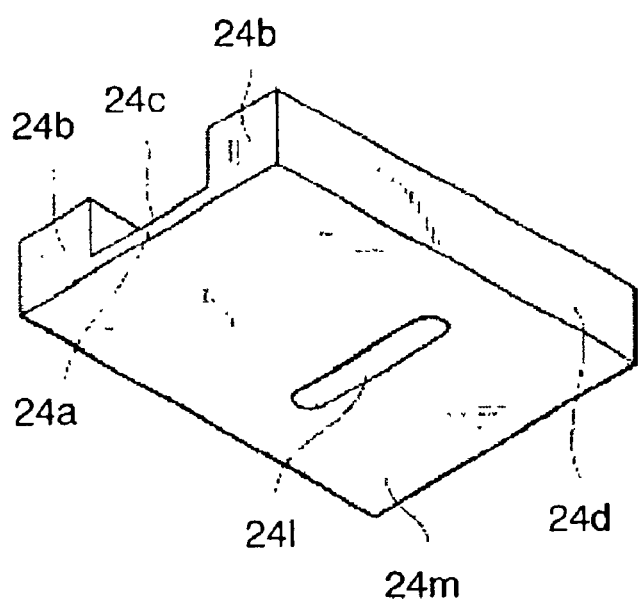

FIGS. 4(a) and 4(b) are views showing another configuration of the container. The container 4b further includes a base portion 24a addition to a pair of side portion 24b, and a rear portion 24d. The container 4b is also preferable to be made of metal. The base portion 24a is parallel to the primary surface of the container 4b. Two side portions 24b and the rear portion 24d define a room 24c for securing the subassembly therein. The rear portion 24d contains a region 24e next to the room 24c to mount the signal processing circuit 10. The container 4b includes regions 24f to 24i for fixing the lead frame 6 thereto. Two regions 24f and 24h are on edges of respective side portion, while regions 24g and 24i are on the rear portion. These regions, 24f to 24i, surround a projection 24j, which is used as an alignment guide for the lead frame 6. The interval between respective side portions is slightly wider than the width of the substrate 12. Bores 24k are provided at the corner between respective side portions and the rear portion. A hole 24l is formed so as to connect the back surface of the container 4b and the room 24c. The bores 24k and the hole 24l enable to spread the surplus resin at the molding. The container may include flat regions 24n to fix the supplementary member of the subassembly that is referred by 2b in FIG. 10.

Figure 5:
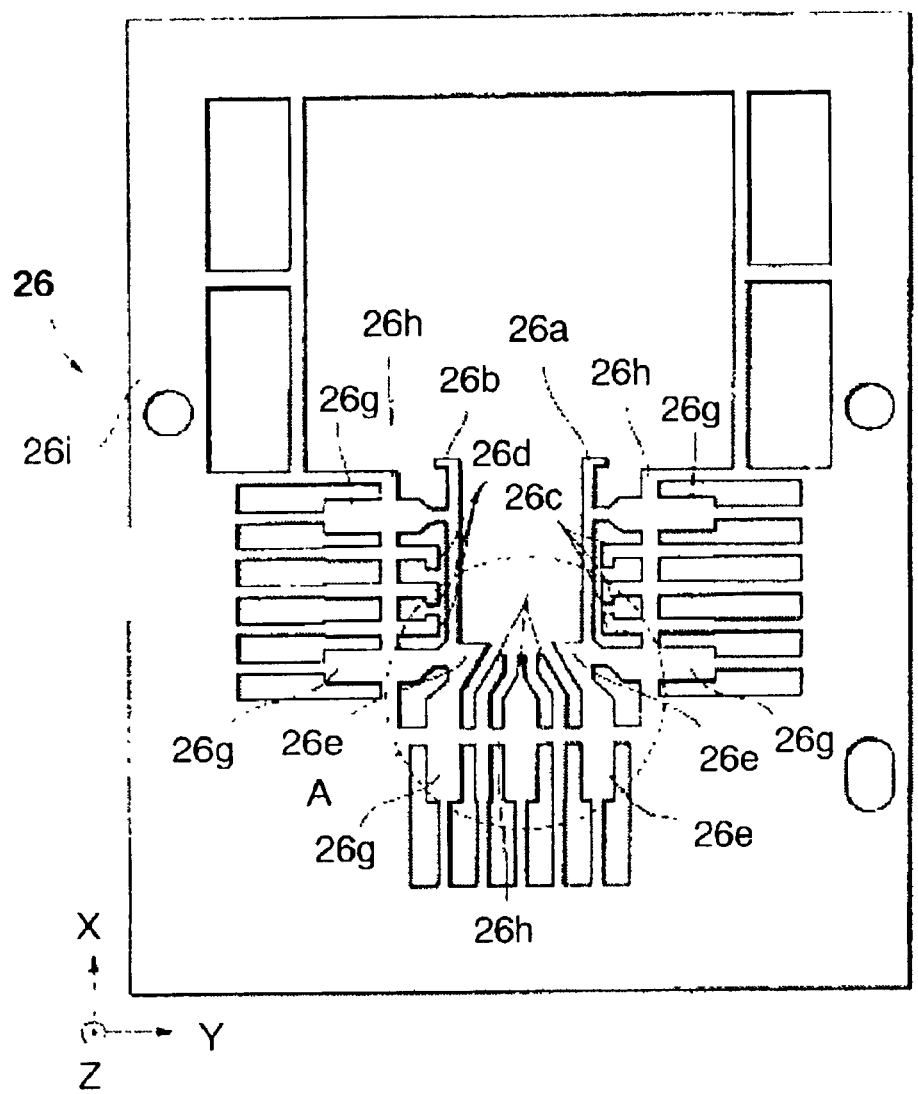
FIG. 5 is a plane view of the lead frame.

FIG. 5 shows a plane view of the lead frame 26. Although the following description refers the one type of the container 4a, ordinal persons in the field would understand that the same explanation would be applicable to another type of the container 4b. The lead frame 26 includes a pair of first fixing bar 26a and 26b to fix the lead frame 6 to regions 22e and 22g on the container 4a, and inner leads 26c and 26d. Since the subassembly 2 is placed in the room between the pair of fixing bars 26a and 26b, the subassembly enables to connect electrically to the respective inner leads 26c and 26d. The lead frame 26 further includes a second pair of fixing bar 26e, another inner leads 26f between the second pair of fixing bar 26e and outer leads 26g. An outer frame 26i supports these leads, the first and the second pairs of fixing bars (26a, 26b, 26e) and inner leads (26c, 26d, 26f) through tie bars 26h.

Figure 6:
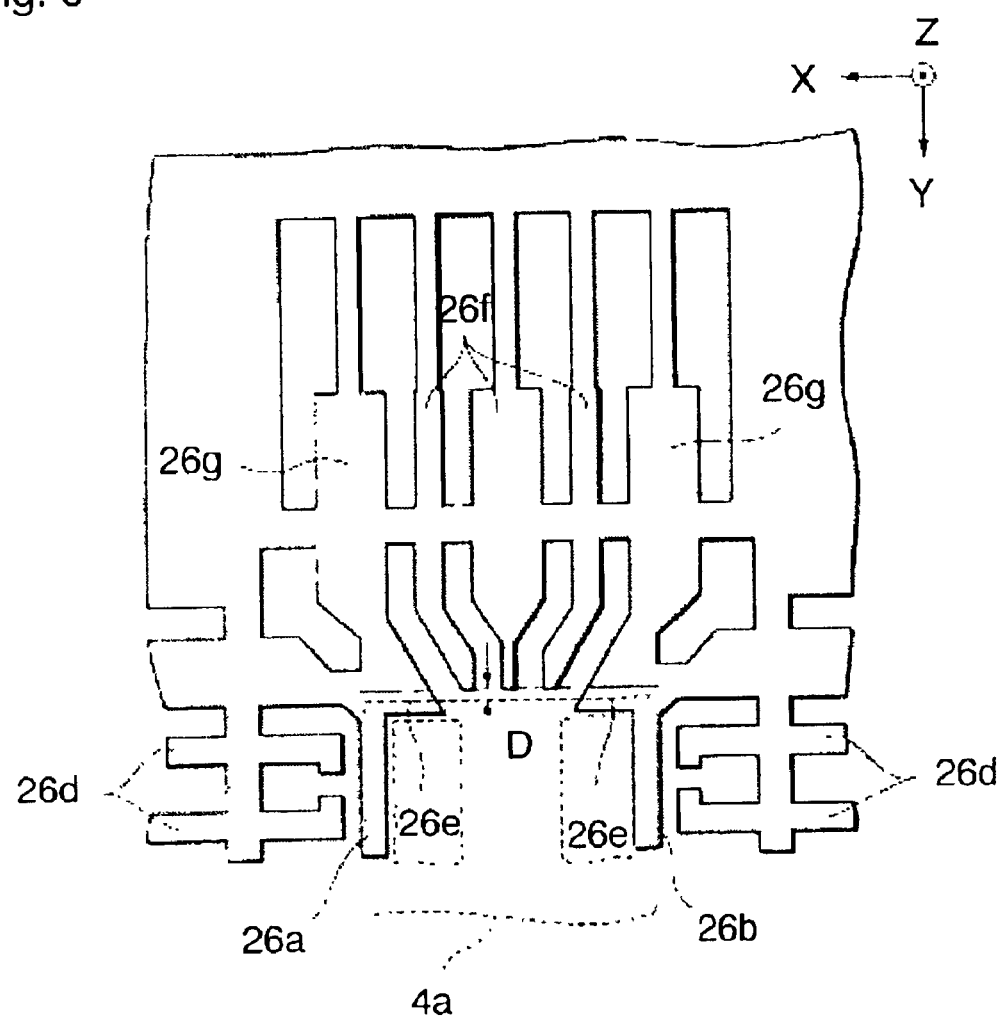
FIG. 6 shows the principal portion of the lead frame.

FIG. 6 is an enlarged view showing a region A circled in FIG. 5. Dotted line in FIG. 6 shows the relative position of the container 4a, which is surrounded by a set of fixing bars (26a, 26b, 26e). The tips of inner leads 26f are spaced by distance D from the edge of the container. Therefore, this configuration enable to arrange the container in the vicinity of the tips of the inner leads 26f without contacting with them.

(Second Embodiment)

Figure 7:
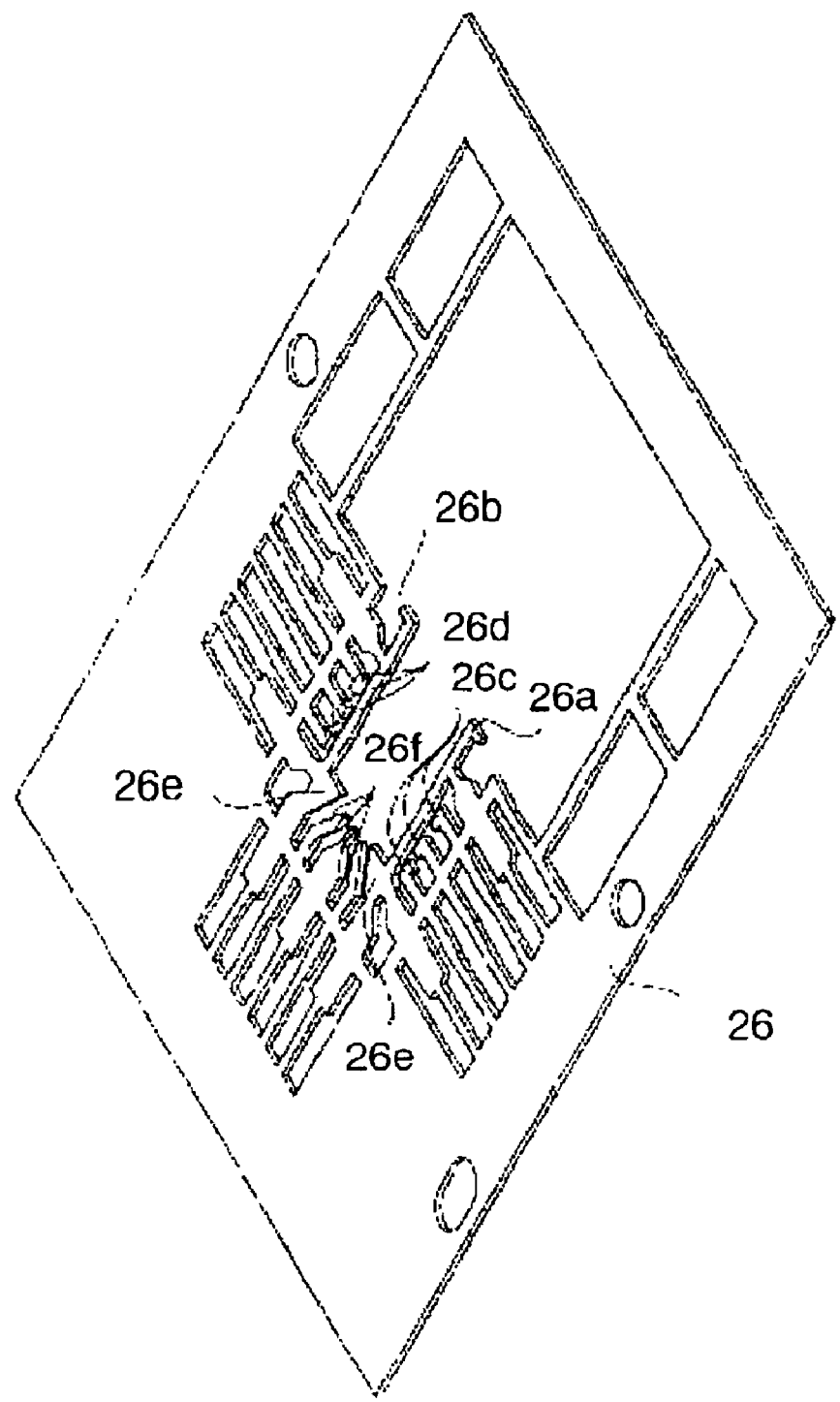
FIG. 7 is a view showing the lead frame.

The next is an explanation of the structure of the module referring to the manufacturing process. First, the lead frame 26 and the container 4b are provided as shown in FIG. 7.

Figure 8:
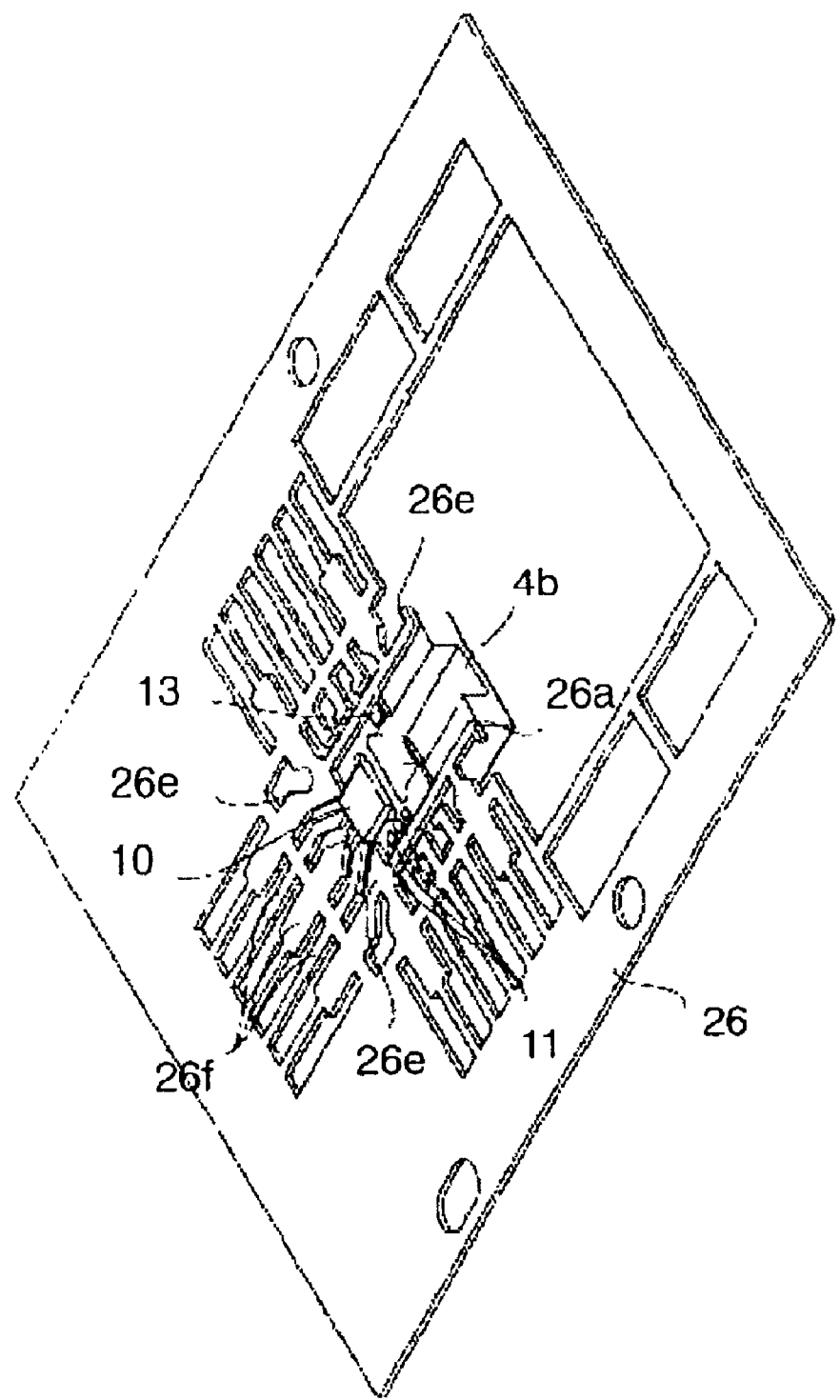
FIG. 8 is a view showing the intermediate product of the invention.

FIG. 8 is a view showing an intermediate product after assembling of the container 4b to the lead frame 26. As shown in FIG. 8, a set of fixing bars (26a, 26b, 26h) of the lead frame 26 is attached to regions from 24f to 24i in FIG. 4b of the container after aligning to the projection 24j. The signal processing circuit 10 and electrical components 11 and 13 are mounted in advance.

Figure 9:
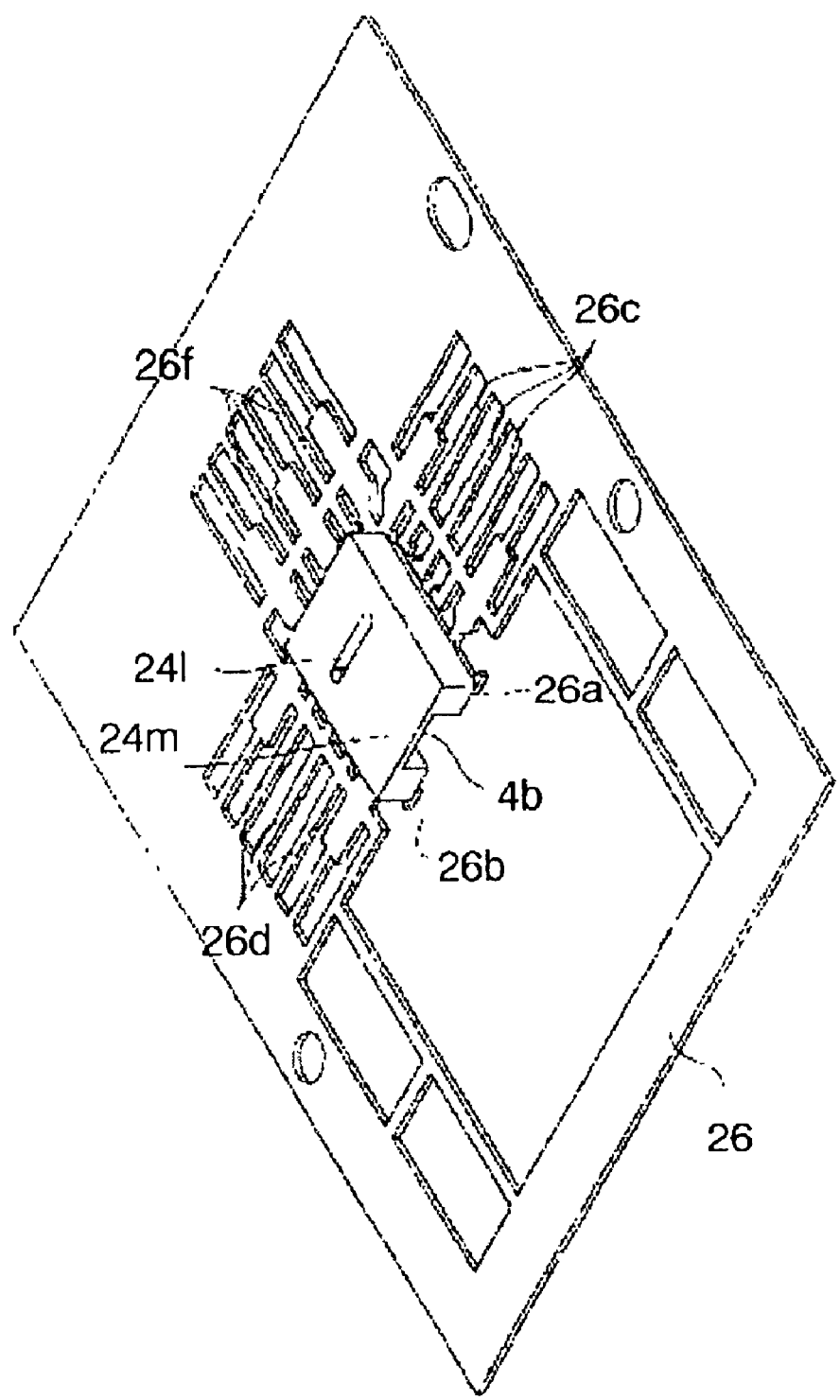
FIG. 9 shows the back view of the intermediate product of the invention.

FIG. 9 shows a back view of the intermediate product of FIG. 8. The hole 24l shown in the back surface of the container 4b enables to flow out the surplus resin. The lead frame 26 has a set of fixing bar (26a, 26b, 26e) instead of an island and a set of fixing bar surrounds the container. This configuration enables to arrange the lead frame 26 around the container 4b.

Figure 10A:
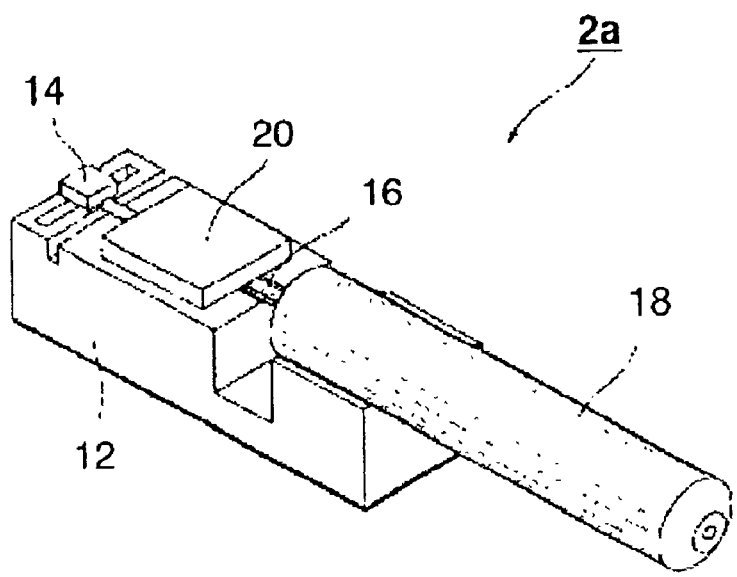
FIG. 10(a) and FIG. 10(b) show two types of the subassembly of the invention.
Figure 10B:
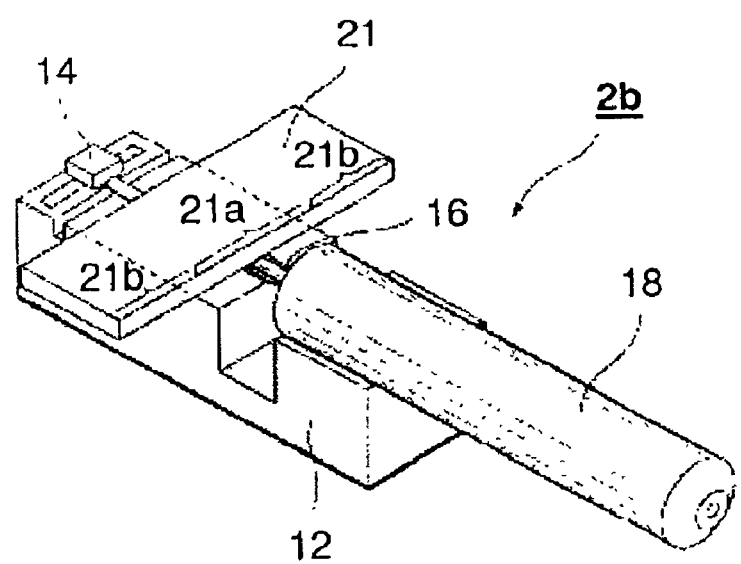

Next, the subassembly of the module is provided. FIGS. 10(a) and 10(b) are views showing subassemblies applicable to the present optical module. The subassembly 2b in FIG. 10(b) provides an another type of supplementary member 21 in place of the member 20 in FIG. 10(a). The supplementary member 21 is divided into two portions, in which one portion 21a is for fixing the optical fiber 16 to the substrate 12 and others 21b extended to both sides of the portion 21a.

Figure 11:
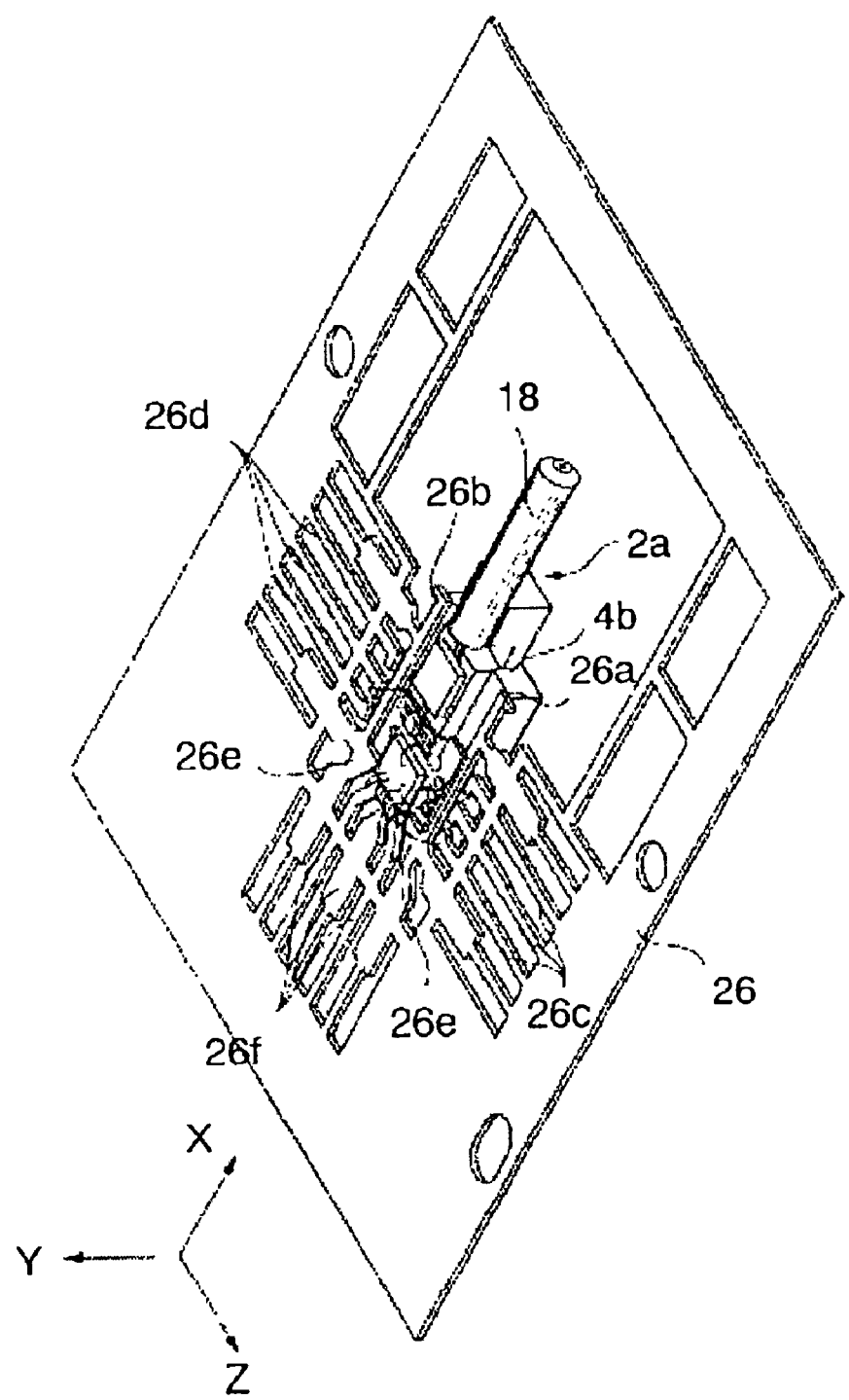
FIG. 11 shows the intermediate product using the subassembly of FIG. 10(a) next to those shown in FIG. 9.

In FIG. 11, the substrate 12 of the subassembly 2a is secured on the base 24a of the container 4b; that is, the substrate 12 is fixed to the base 24a by a conductive adhesive. Positional adjustment of the subassembly 2a performs the direction of the ferrule 18 to align the X-axis. After the alignment, the wire bonding performs electrical connections between the subassembly 4b and the lead frame 26. Since the depth of the room for securing the subassembly is nearly equal to the thickness of the substrate 12, the level of the primary surface of the lead frame 6 corresponds with the primary surface of substrate 12. Thus, the optical axis of the fiber 16 is substantially contained in the hypothetical surface formed by the primary surface of the lead frame 6.

Figure 12:
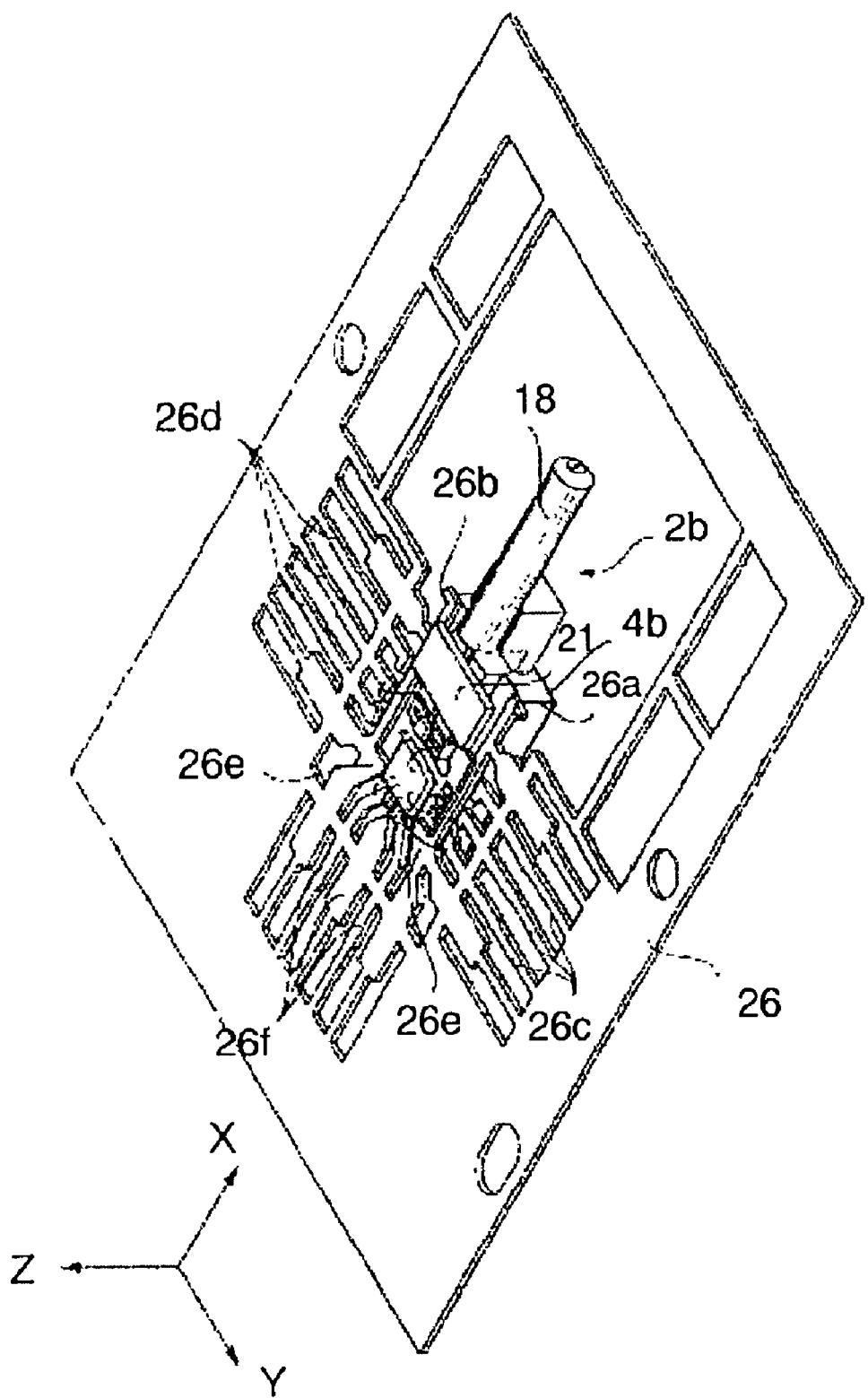
FIG. 12 shows the intermediate product using the another type of the subassembly of FIG. 10(b)

In FIG. 12, the supplementary member 21 in the subassembly 2b is fixed to the container 4b, consequently the subassembly 2b is aligned in the container 4b. In the case that the supplementary member 21 is made of transparent material, such as a glass sheet, an UV-cured resin enables to fix the member 21 to regions 24n in FIG. 4 similar to the fixing of the supplementary member 21 to the substrate 12. In this configuration, the ferrule 18 of the subassembly 2a is aligned to the X-direction, which is same as the case in FIG. 11. Since the height of the side portion 24b is larger than the thickness of the substrate 12, the level of the primary surface of the subassembly 2b is determined by the supplementary member 12, which is different to the case of FIG. 11.

Figure 13:
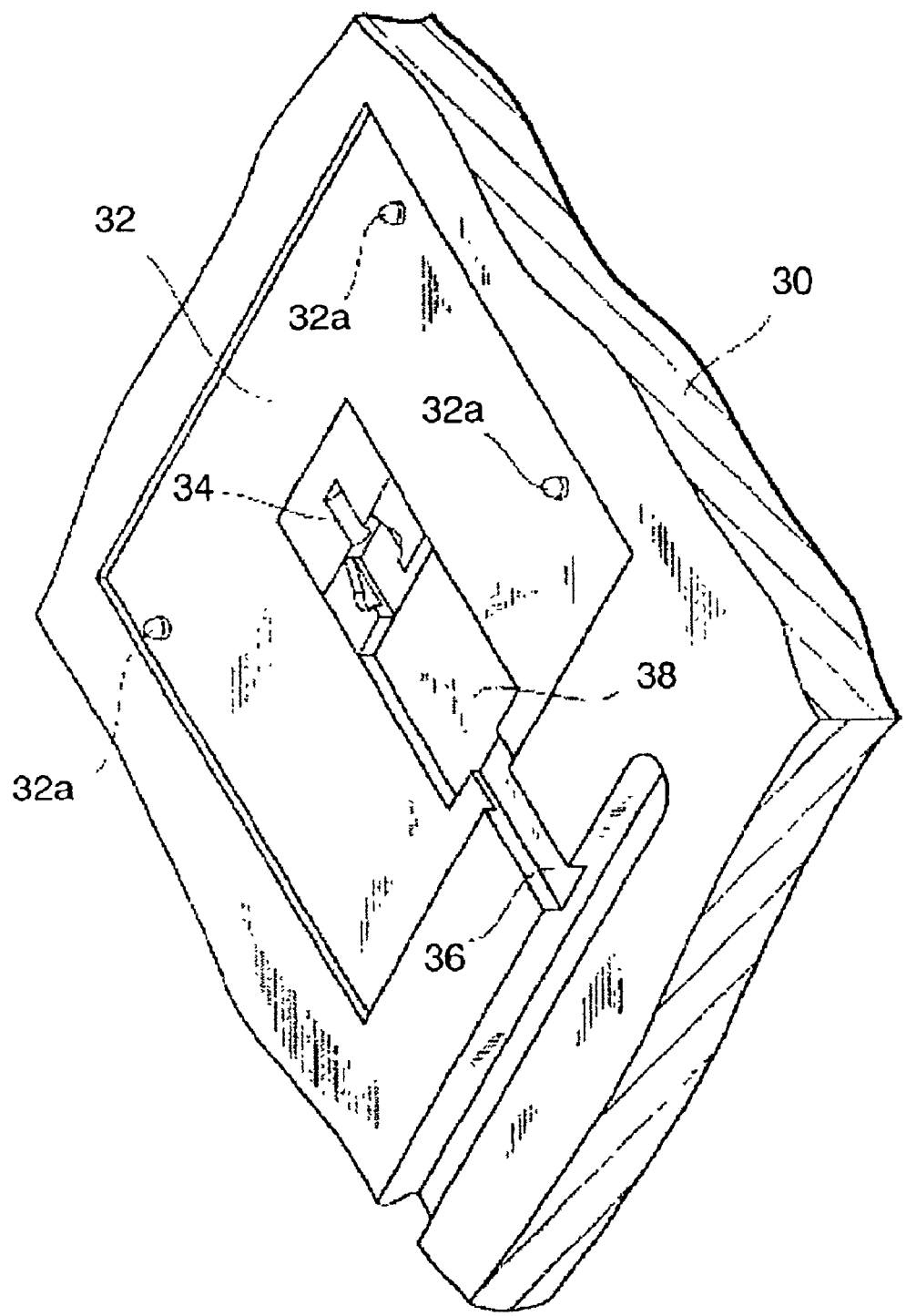
FIG. 13 is a view showing the mold die.

A mold resin using a die shown in FIG. 13 packages intermediate products shown in FIG. 11 and FIG. 12. FIG. 13 shows the lower mold die 30. Mold resin functions as an adhesive because the resin flows into the narrow space between the subassembly and the container. The mold die 30 has a section 32 for receiving the lead frame. Several protrusions 32a to 32c are in the section for adjusting the position of the lead frame to the mold die. A depression 34 for receiving the ferrule 18 is in the cavity 38. Once the lead frame is put on the section, the ferrule is automatically set in the depression 34. Since the position of the ferrule is aligned to the lead frame 26 through the container 4, unexpected residual stress is released from the housing. After setting the intermediate product to the mold die, the mold resin is flowed into the cavity 38 through the gate 36.

Figure 14:
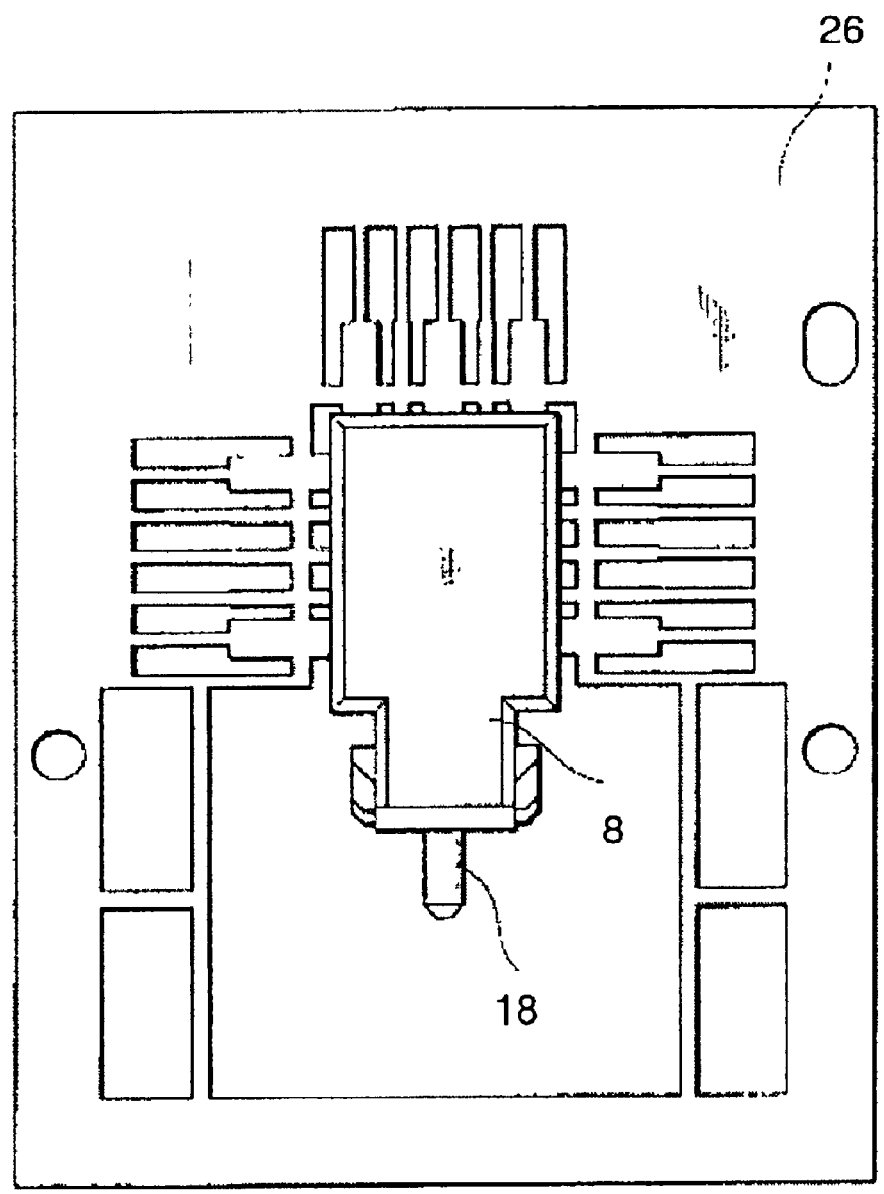
FIG. 14 shows the intermediate product next to those shown in FIG. 11 and FIG. 12.

FIG. 14 shows the intermediate product after the resin 3 molding. Tie bars are cut after the molding and outer leads are reformed downwardly.

Figure 15A:
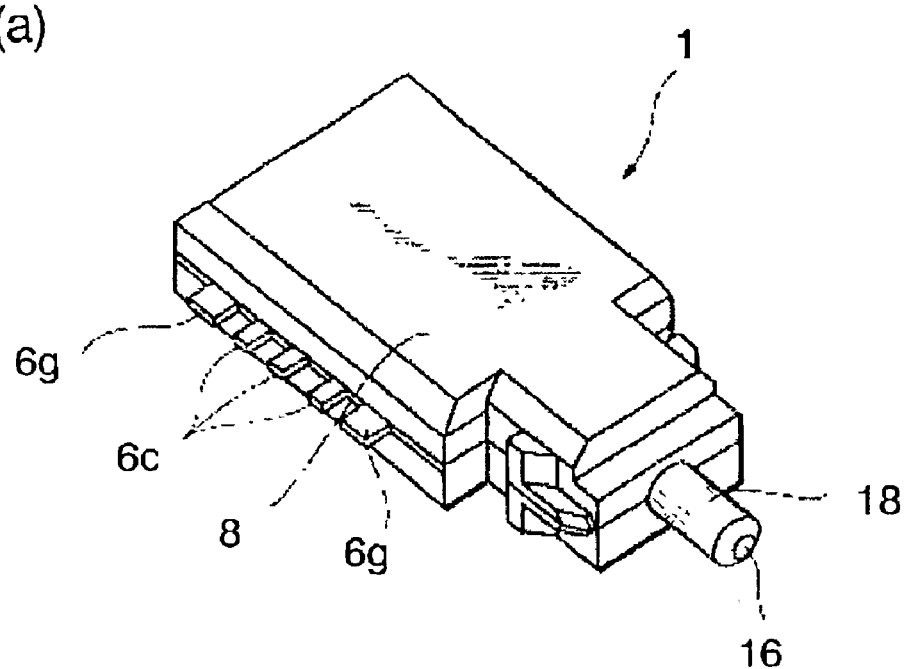
FIG. 15(a) and FIG. 15(b) show the complete product of the invention, which is resin molded.
Figure 15B:
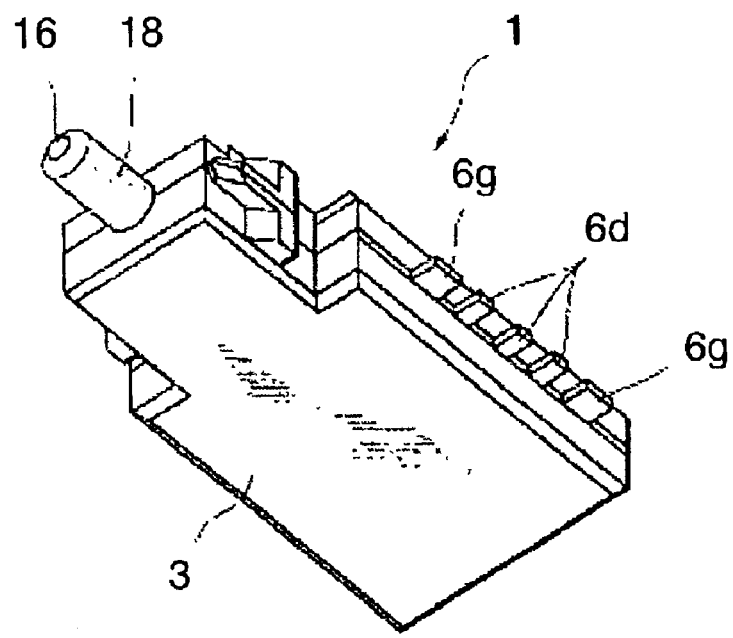

FIG. 15(a) shows an upper view of the final product of the module, while FIG. 15(b) is a lower view. A set of leads (6c, 6d, and 6f) is projected from the side surface of the housing. Lead 6f is not shown in FIG. 15. The hypothetical surface containing leads (6c, 6d, and 6f) substantially coincide with the optical axis of the ferrule. In the present module, leads (6c, 6d, 6f) are protruded from the respective side surface of the molded housing 8, while the ferrule 18 is arranged at the rest side surface of the housing. Both sides of the ferrule 18 provide protrusions for mating an optical connector thereto.

(Third Embodiment)

Another configuration of the module will be described as referring the manufacturing procedure. First, The container 4a and the lead frame 26 are attached to each other. As shown in FIG. 3, the container 4a does not provide the base 24a in FIG. 4.

Figure 16:
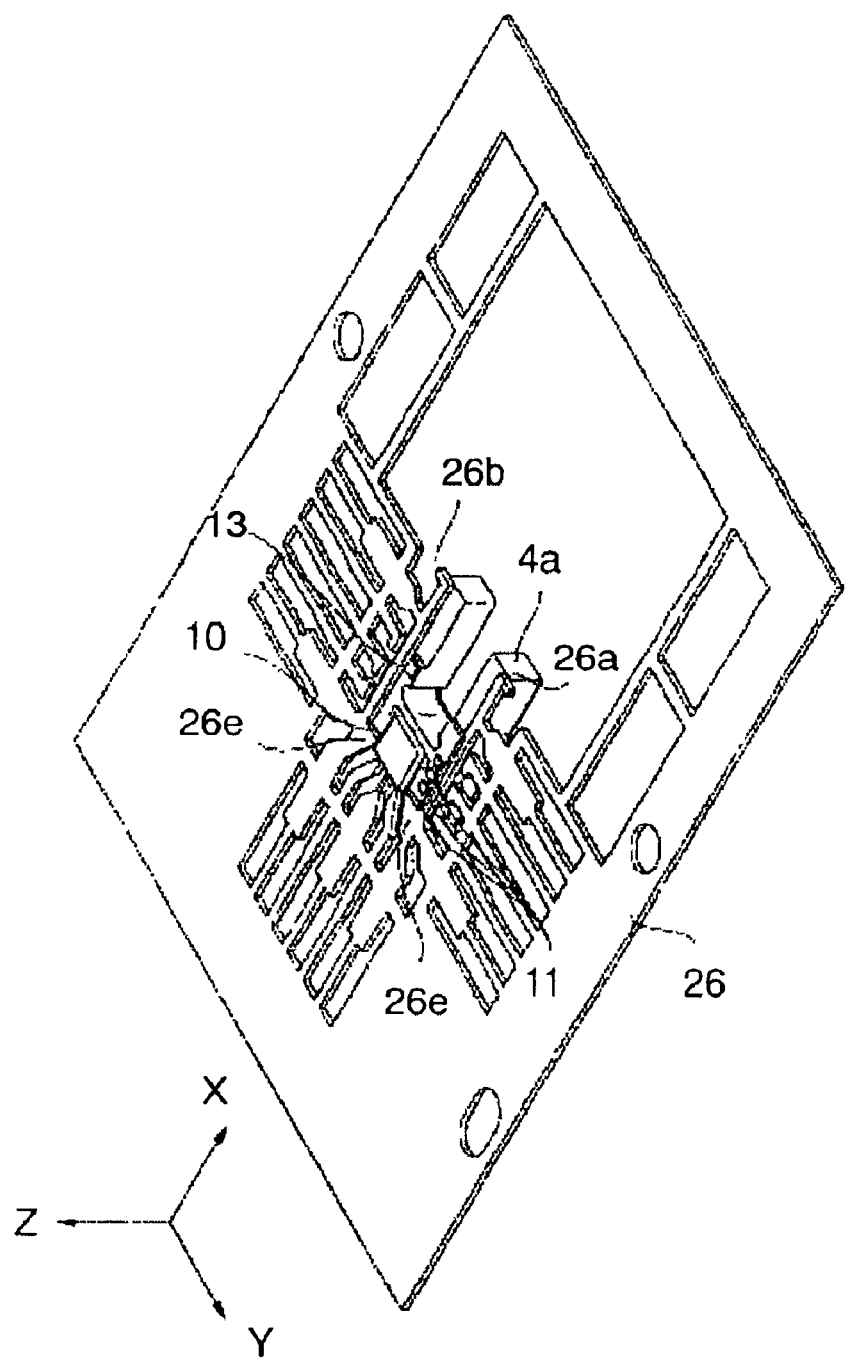
FIG. 16 is a view showing another type of the intermediate product.

FIG. 16 shows the intermediate products after fixing the lead frame 6 to the container 4a. The projection 22j enables the lead frame 26 to align the container 4a. After aligning the lead frame to the projection 22j, a set of fixing bars (26a, 26b, 26h) of the lead frame 26 is attached to regions (22e to 22h in FIG. 4a) of the container. The signal processing circuit 10 and electrical components 11, 13 are mounted in advance thereon.

Figure 17:
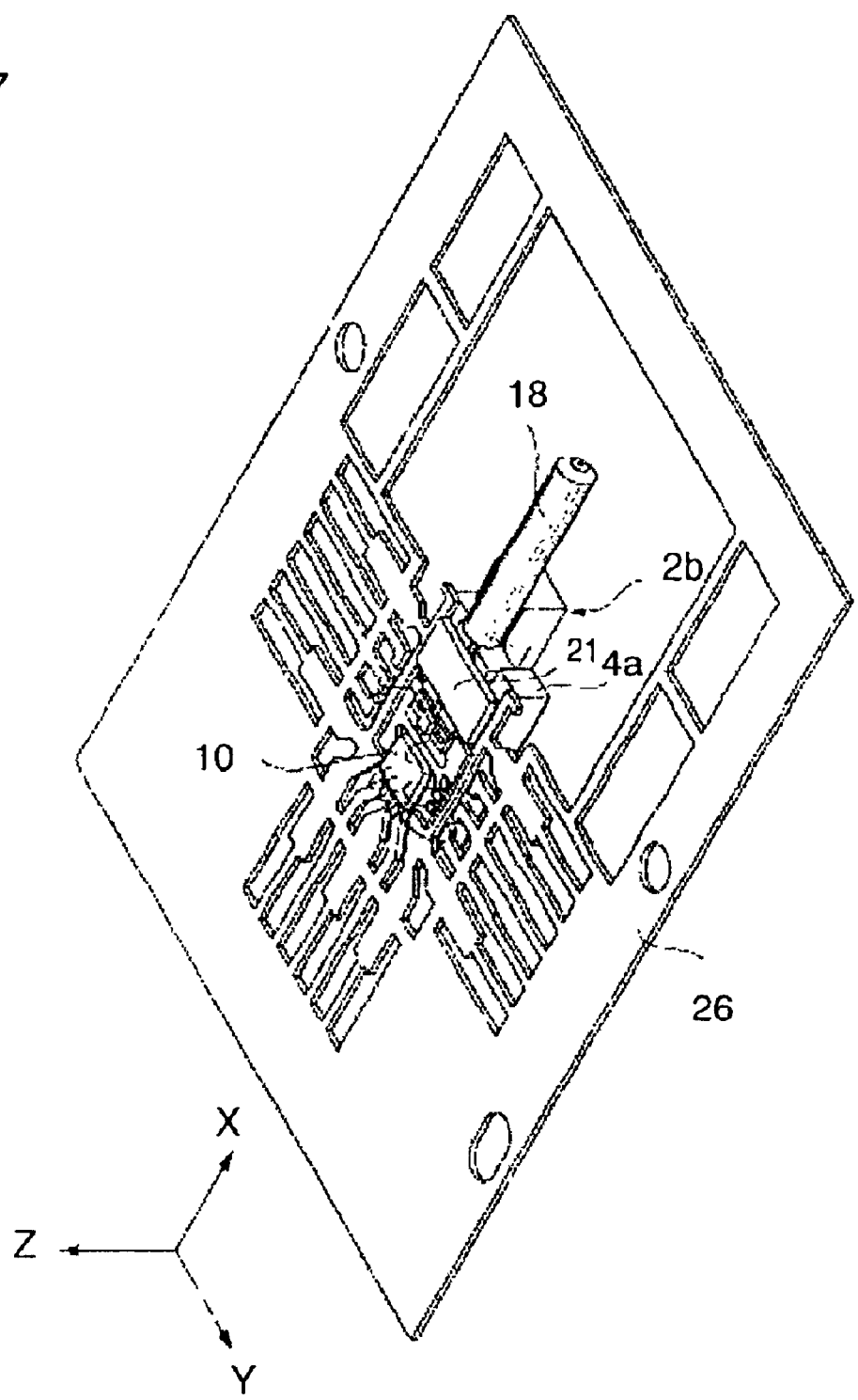
FIG. 17 shows the intermediate product next to those shown in FIG. 16.

The subassembly 2b is arranged in the container 4a in FIG. 17. The supplementary member 21 subassembly 2b supports the container 4a thereon and defines the position of the subassembly. The UV-cured resin is used as an adhesive for the supplementary member 21 to be fixed to flat regions 22k in FIG. 3 of the container 4a. In this configuration, the ferrule 18 in the subassembly 2b is aligned to the X-direction same as the case in FIG. 11 and FIG. 12.

The following processes are same as the second embodiment with referring to figures from 13 to 15.

(Fourth Embodiment)

Figure 18:
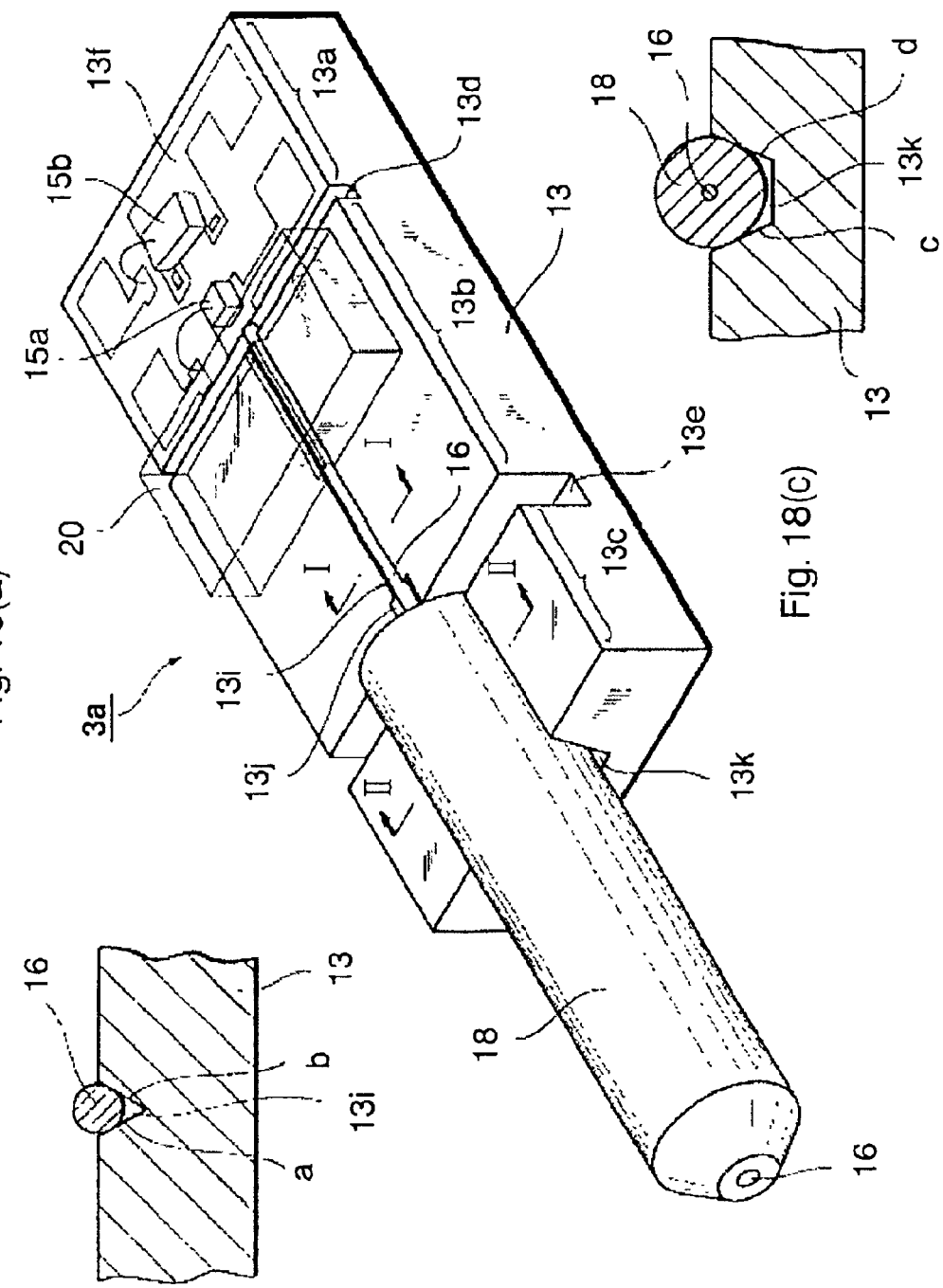
FIG. 18(a) is a view showing the subassembly of the light emitting module.
FIG. 18(b) is a cross-sectional view along I—I in FIG. 18(a) and FIG. 18(c) is a cross-sectional view along II—II in FIG. 18(a)

While embodiments previously described are the light-receiving module in which the semiconductor light-receiving device is contained, the present embodiment is the light-emitting module as referring to FIG. 18. The subassembly 3a includes a substrate 13, a light-emitting semiconductor device 15, an optical fiber 16, a ferrule 18 and a supplementary member 20.

As shown in FIG. 18(a), the substrate comprises a first region 13a, a second region 13b and a third region 13c, each of which are along an optical axis of the fiber 16 and arranged in this order. A groove 13d between the first region and the second region provides a fiber-abutted surface. The fiber-abutted surface defines the tip position of the fiber. A region 13f, the light-emitting device 15a and a light-monitoring device 15b are mounted thereon, is provided in the first region 13a.

Light emitted from one surface of the device 15a enters into the tip of the fiber 16, while light from another surface of the device 15a enters into the monitoring device 15b, such as a photo diode. The second region 13b provides a groove 13i for securing the fiber 16 by two surfaces of the groove. It may be preferable to prepare another groove 13j between the second and the third regions. The third region 13c includes another groove 13k for supporting the ferrule 18. Typical cross sectional configuration of the grooves 13i and 13k are V-shaped and trapezoid, respectively. FIG. 18(b) shows the cross-sectional view of the groove 13i along I—I line, while FIG. 18(c) shows the view of the groove 13k along II—II line.

The substrate 13 mounts the light-emitting device 15a, the light receiving device 15b, the optical fiber 16 and the ferrule 18 thereon. The ferrule 18 protects the fiber 16, which is set within the groove 13k. The light-emitting device 15a is optically coupled to one tip of the fiber. Another tip of the fiber is exposed on the one facet of the ferrule. The supplementary member 20 fixes the fiber to the substrate. Thus the position of the fiber is defined.

Figure 19:
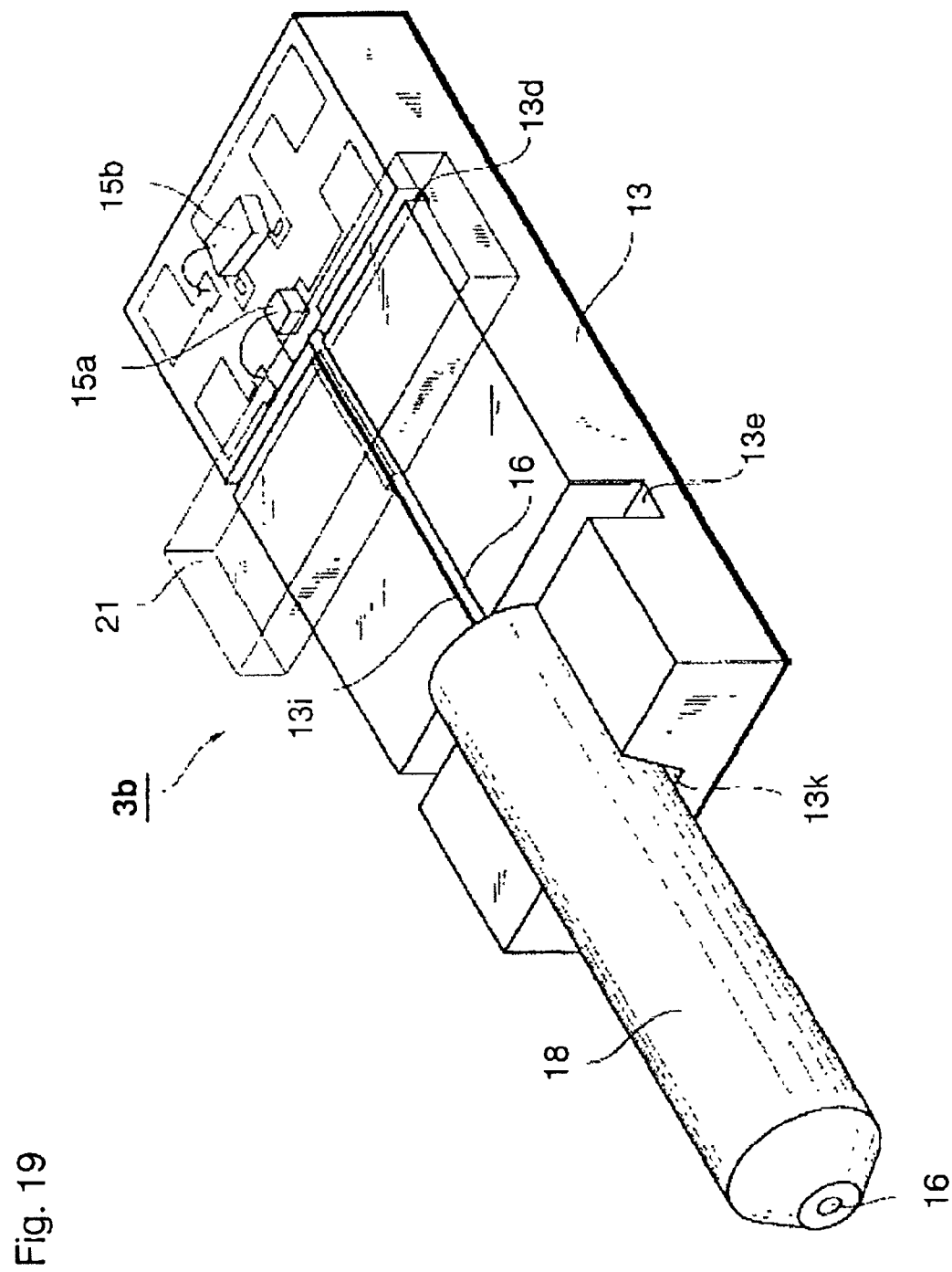
FIG. 19 shows another type of the subassembly of the light emitting module.

FIG. 19 shows another example of the subassembly for the light-emitting module. The subassembly 3b is the same with the subassembly 3a except for the supplementary member 21 is used in the subassembly 3b instead of the member 20 in the subassembly 3a.

Relations of the primary surface of the lead frame 6 to that of the container 4b are shown in FIGS. from 20(a) to 20(d). Numerals from 38a to 38d correspond to adhesive. As shown in FIGS. 20(a) to 20(d), the level of the surface of the lead frame coincides with the primary surface of the container according to the present invention.

From the invention thus described, it will be obvious that the invention may be varied in many ways. Although one type of the resin molded housing is described, other shapes are considered to be within the scoped of the present invention. Similarly, the configuration of the lead frame, the container and so on are not restricted to embodiments disclosed in the specification. Such variations are not to be regarded as a departure from the spirit and scope of the invention, and all such modifications as would be obvious to one skilled in the art are intended for inclusion within the scope of the following claims.

We claim:

1. An optical communication module, comprising:

a subassembly including a substrate for mounting an optical semiconductor device, an optical fiber, and a ferrule for securing said optical fiber thereon, said optical fiber coupled to said semiconductor device;

a container for securing said subassembly;

a lead frame for fixing said container thereto, said lead frame having a primary surface; and a resin molded housing for covering said subassembly, said container and said lead frame, wherein an optical axis of said optical fiber is set substantially within said primary surface of said lead frame, and wherein said ferrule and said lead frame protrude from said housing.

2. The optical module according to the claim 1, wherein said container includes a pair of side portion extending along to a first direction for defining a room for securing said subassembly, said side portions having regions on respective edges thereof for fixing said lead frame thereto, and a rear portion extending along to a second direction intersecting said first direction for connecting said pair of side portion, said rear portion having a device-mounted area thereon.

3. The optical module according to the claim 2, wherein said lead frame includes a pair of fixing bar extending along said first direction, said pair of fixing bar corresponding to respective regions provided on said side portions of said container, and a plurality of inner leads extending along said second direction, said respective inner leads having a tip corresponding to one of said pair of fixing bar.

4. The optical module according to the claim 2, wherein said subassembly further includes a supplemental member comprising a first portion for fixing said optical fiber to said substrate, and a pair of second portion, respective said second portions extending to both sides of said first portion, said respective second portions being supported by said respective side members of said container.

5. The optical module according to the claim 2, wherein said container further includes a base portion for holding said pair of side portion and said rear portion, wherein said pair of side portion and said base portion form said room for securing said subassembly.

6. The optical module according to the claim 5, wherein said subassembly further includes a supplemental member for fixing said optical fiber to said substrate, and said subassembly is secured within said room defined by said pair of side portion and said base portion.

7. The optical module according to the claim 5, wherein said subassembly further includes a supplemental member comprising a first portion for fixing said optical fiber to said substrate, and a pair of second portion, said second portions extending to both sides of said first portion, said second portions being supported by said respective side members of said container.

8. The optical module according to the claim 1, wherein said container is made of metal.

9. The optical module according to the claim 1, wherein said semiconductor device is a light emitting device.

10. The optical module according to the claim 1, wherein said semiconductor device is a light receiving device.

* * * * *